United States Patent
Lee et al.

(10) Patent No.: US 9,040,838 B2
(45) Date of Patent: May 26, 2015

(54) METHOD FOR FORMING SOLDER RESIST AND SUBSTRATE FOR PACKAGE

(71) Applicant: SAMSUNG ELECTRO-MECHANICS CO., LTD., Suwon (KR)

(72) Inventors: Chang Bo Lee, Suwon (KR); Chang Sup Ryu, Suwon (KR); Hyo Bin Park, Yeongi-gun (KR); Cheol Ho Choi, Suwon (KR)

(73) Assignee: SAMSUNG ELECTRO-MECHANICS CO., LTD., Suwon (KR)

( * ) Notice: Subject to any disclaimer, the term of this patent is extended or adjusted under 35 U.S.C. 154(b) by 18 days.

(21) Appl. No.: 14/011,159

(22) Filed: Aug. 27, 2013

(65) Prior Publication Data

US 2014/0054073 A1    Feb. 27, 2014

(30) Foreign Application Priority Data

Aug. 27, 2012    (KR) .................... 10-2012-0093680

(51) Int. Cl.
| | |
|---|---|
| *H05K 1/03* | (2006.01) |
| *H05K 1/00* | (2006.01) |
| *H05K 7/10* | (2006.01) |
| *H05K 1/02* | (2006.01) |
| *H05K 3/00* | (2006.01) |
| *H01L 23/498* | (2006.01) |
| *H01L 21/48* | (2006.01) |
| *H05K 3/34* | (2006.01) |
| *H01L 23/00* | (2006.01) |

(52) U.S. Cl.
CPC ............ *H05K 1/0296* (2013.01); *H05K 3/0023* (2013.01); *H05K 3/3452* (2013.01); *H05K 2203/058* (2013.01); *H05K 2203/0597* (2013.01); *H05K 2203/1173* (2013.01); *H01L 24/16* (2013.01); *H01L 2224/16225* (2013.01); *H01L 23/498* (2013.01); *H01L 21/4846* (2013.01)

(58) Field of Classification Search
USPC .................... 174/255, 256, 258, 263; 361/767
See application file for complete search history.

(56) References Cited

U.S. PATENT DOCUMENTS

| | | | | |
|---|---|---|---|---|
| 4,766,268 A | * | 8/1988 | Uggowitzer | 174/256 |
| 2008/0315417 A1 | * | 12/2008 | Shen et al. | 257/738 |
| 2009/0179335 A1 | * | 7/2009 | Oh et al. | 257/783 |

FOREIGN PATENT DOCUMENTS

| | | |
|---|---|---|
| KR | 10-0815361 B1 | 3/2008 |
| KR | 10-2008-0092783 | 10/2008 |
| KR | 10-0905568 B1 | 7/2009 |

* cited by examiner

*Primary Examiner* — Timothy Thompson
*Assistant Examiner* — Sherman Ng

(57) ABSTRACT

The present invention relates to a method for forming solder resist and a substrate for a package. The method for forming solder resist including: forming a first solder resist inner region by primarily coating, exposing, and developing a solder resist on a substrate on which an outer PoP pad and an inner chip pad are formed, and removing the solder resist's outer portion on the substrate's outer region and curing the solder resist's inner portion on the substrate's inner region; forming a plugged SR region which does not expose the substrate; changing a surface roughness by performing a desmear process on a surface of the first solder resist inner region in which the plugged SR region is formed; and forming a second solder resist SMD region which covers an edge of the PoP pad, exposing, and developing the solder resist on the substrate after the desmear process is provided.

6 Claims, 4 Drawing Sheets

- PRIOR ART -

- PRIOR ART -

- PRIOR ART -

- PRIOR ART -

- PRIOR ART -

- PRIOR ART -

METHOD FOR FORMING SOLDER RESIST AND SUBSTRATE FOR PACKAGE

CROSS-REFERENCE TO RELATED APPLICATIONS

This application claims the foreign priority benefit under 35 U.S.C. Section 119 of Korean Patent Application Serial No. 10-2012-0093680, filed Aug. 27, 2012, which is hereby incorporated by reference in its entirety into this application.

CROSS REFERENCE TO RELATED APPLICATION

This application claims the benefit under 35 U.S.C. Section 119 of Korean Patent Application Serial No. 10-2012-0093680, entitled filed Aug. 27, 2012, which is hereby incorporated by reference in its entirety into this application.

BACKGROUND OF THE INVENTION

1. Field of the Invention

The present invention relates to a method for forming solder resist and a substrate for a package, and more particularly, to a method for forming solder resist and a substrate for a package that can differentiate a surface roughness of an inner chip mounting region from a surface roughness of an outer upper package mounting region.

2. Description of the Related Art

In manufacturing a circuit board, for example, a PCB, multiple layers of solder resist (SR) is formed according to the need. As can be seen from a package on package (PoP) substrate as a typical example, an SR thickness is small in a flip-chip mounting region or a controlled collapsed chip connect (C4) region but large in a PoP region. At this time, in an inner region including the C4 region, SR is opened in the shape of a fine peripheral bump, a bump on line (BOL), and a solder on pad (SOP), and in the PoP region, the SR is opened to be larger than the SOP of the C4 region. When performing packaging, chip attaching of the C4 region and package attaching of the PoP region are performed, respectively. Since underfill flow characteristics are different, it is needed to differentiate SR surface energy of the C4 region from SR surface energy of the PoP region. Further, in order to effectively perform underfill flow in the C4 region, it is not needed to open the SR up to an inner layer, but it is needed to open the SR slightly lower than a height of Cu as a circuit pattern.

FIGS. 2a to 2f are views schematically showing a conventional method for forming solder resist.

When forming 2-step SR 31 by the conventional method (refer to FIGS. 2a to 2d), it is difficult to differentiate SR surface energy of a C4 region from SR surface energy of a PoP region and properly fill the SR between Cu patterns 35. Although a plasma treatment etc. can be inserted in a process to differentiate SR surface energy, it is needed to overcome the problem of filling the SR between the Cu patterns 35.

RELATED ART DOCUMENT

Patent Document

Patent Document 1: Korean Patent Laid-open Publication No. 10-2008-0092783 (laid-open on Oct. 16, 2008)

Patent Document 2: Korean Patent Publication No. 10-0815361 (laid-open on Mar. 19, 2008)

SUMMARY OF THE INVENTION

The present invention has been invented in order to overcome the above-described problems and it is, therefore, an object of the present invention to provide a method for forming solder resist and a substrate for a package that can differentiate a surface roughness of an inner chip mounting region from a surface roughness of an outer upper package mounting region.

In accordance with a first embodiment of the present invention to achieve the object, there is provided a method for forming solder resist including the steps of: forming a first solder resist inner region by primarily coating, exposing, and developing a solder resist on a substrate on which a circuit pattern comprising an outer package-on-package (PoP) pad for mounting an upper package thereon and an inner chip pad for mounting an inner chip is formed, and removing an outer portion of the solder resist on an outer region of the substrate on which the PoP pad is formed and curing an inner portion of the solder resist on an inner region of the substrate on which an inner circuit pattern comprising the chip pad is formed; forming a plugged SR region which does not expose the substrate while exposing the entire upper surface of the chip pad by performing a laser ablation process on the first solder resist inner region; changing a surface roughness by performing a desmear process on a surface of the first solder resist inner region in which the plugged SR region is formed; and forming a second solder resist SMD region by secondarily coating, exposing, and developing the solder resist on the substrate after the desmear process and curing the secondarily coated solder resist region which covers an edge of the PoP pad and removing the remaining solder resist region secondarily coated on an inner region of the PoP pad and the first solder resist inner region.

At this time, in an example, the inner circuit pattern including the chip pad may further include a bump pad formed around the chip pad, the first solder resist inner region may be formed in the step of forming the first solder resist inner region by curing the inner portion of the solder resist on the inner region of the substrate on which the inner circuit pattern including the chip pad and the bump pad is formed, and the plugged SR region which does not expose the substrate while exposing the entire upper surface of the chip pad and the bump pad may be formed in the step of forming the plugged SR region by performing the laser ablation process on the first solder resist inner region.

Further, in an example, the step of forming the first solder resist inner region may include the steps of: primarily coating the solder resist on the substrate; primarily exposing to cure the first solder resist inner region on the inner region of the substrate on which the inner circuit pattern including the chip pad is formed; and primarily developing and curing the solder resist to remove the outer portion of the solder resist on the outer region of the substrate on which the PoP pad is formed and leave the first solder resist inner region.

In another example, in the step of forming the plugged SR region, the plugged SR region may be formed to have a height lower than a height of the upper surface of the chip pad.

Further, in accordance with an example, the step of forming the second solder resist SMD region may include the steps of: secondarily coating the solder resist on the substrate after the desmear process; secondarily exposing to cure the second solder resist SMD region which covers an edge of the first solder resist inner region and the edge of the PoP pad; and secondarily developing and curing the solder resist to remove the remaining solder resist region secondarily coated on the inner region of the POP pad and the first solder resist inner region and leave the second solder resist SMD region.

At this time, in another example, the step of forming the second solder resist SMD region may further include the step of improving a surface roughness of the second solder resist SMD region differently from the surface roughness of the first solder resist inner region by performing a desmear process on a surface of the second solder resist SMD region.

Further, in an example, the solder resist may be made of one of a photocurable resin, a thermosetting resin, and photocurable and thermosetting resins.

In accordance with another example, the solder resist may be ink type or dry film type.

At this time, in an example, the primarily coated solder resist may be ink type, and the secondarily coated solder resist may be dry film type.

Next, in accordance with a second embodiment of the present invention to achieve the object, there is provided a substrate for a package including: a substrate; a circuit pattern formed on the substrate and including an outer PoP pad for mounting an upper package thereon and a chip pad for mounting an inner chip thereon; a first solder resist inner region formed by being coated on an inner region of the substrate on which the inner circuit pattern including the chip pad is formed, including a plugged SR region which does not expose the substrate while exposing the entire upper surface of the chip pad by laser ablation, and desmeared to have a changed surface roughness; and a second solder resist SMD region formed to cover an edge of the first solder resist inner region and an edge of the POP pad and having a surface roughness different from a surface roughness of the plugged SR region on the first solder resist inner region.

At this time, in an example, the surface roughness of the plugged SR region on the first solder resist inner region may be higher than the surface roughness of the second solder resist SMD region.

Further, in accordance with an example, the inner circuit pattern including the chip pad may further include a bump pad formed around the chip pad, the first solder resist inner region may be formed on the inner region of the substrate on which the inner circuit pattern including the chip pad and the bump pad is formed, and the plugged SR region may be formed by laser ablation not to expose the substrate while exposing the entire upper surface of the chip pad and the bump pad.

In another example, a height of the plugged SR region may be lower than a height of the upper surface of the chip pad.

Further, in an example, a height of the second solder resist SMD region may be higher than a height of the first solder resist inner region.

Further, in accordance with an example, the first solder resist inner region and the second solder resist SMD region may be made of one of a photocurable resin, a thermosetting resin, and photocurable and thermosetting resins.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Figure 1A:
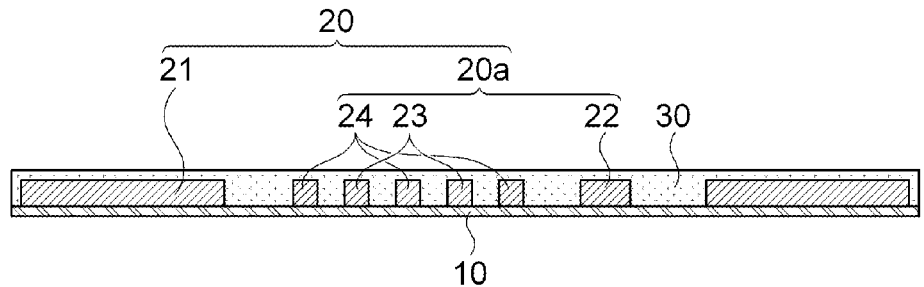
FIGS. 1a to 1g are views schematically showing a method for forming solder resist in accordance with an embodiment of the present invention.

Embodiments of the present invention to achieve the above-described objects will be described with reference to the accompanying drawings. In this description, the same elements are represented by the same reference numerals, and additional description which is repeated or limits interpretation of the meaning of the invention may be omitted.

In this specification, when an element is referred to as being "connected or coupled to" or "disposed in" another element, it can be "directly" connected or coupled to or "directly" disposed in the other element or connected or coupled to or disposed in the other element with another element interposed therebetween, unless it is referred to as being "directly coupled or connected to" or "directly disposed in" the other element.

Although the singular form is used in this specification, it should be noted that the singular form can be used as the concept representing the plural form unless being contradictory to the concept of the invention or clearly interpreted otherwise. It should be understood that the terms such as "having", "including", and "comprising" used herein do not preclude existence or addition of one or more other elements or combination thereof.

The drawings referenced in this specification are provided as examples to describe the embodiments of the present invention, and the shape, the size, and the thickness may be exaggerated in the drawings for effective description of technical features.

First, a method for forming solder resist in accordance with an embodiment of the present invention will be specifically described with reference to the drawings. At this time, the reference numeral that is not mentioned in the reference drawing may be the reference numeral that represents the same element in another drawing.

FIGS. 1a to 1g are views schematically showing a method for forming solder resist in accordance with an embodiment of the present invention.

Figure 1B:
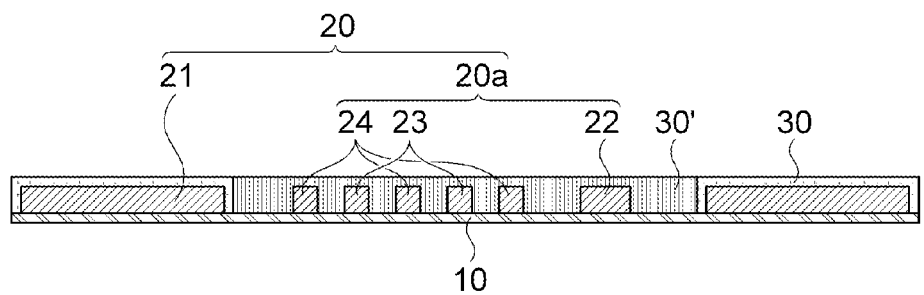
Figure 1C:
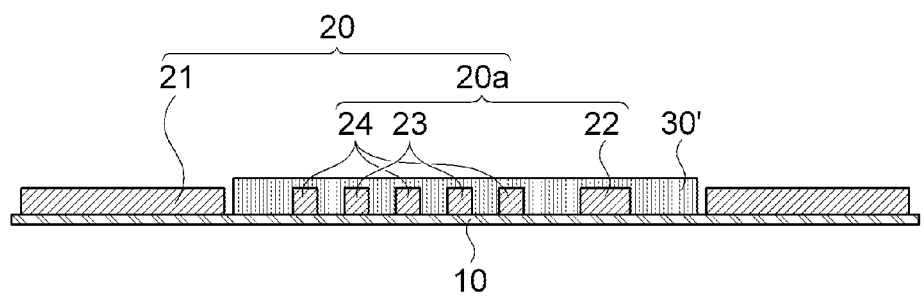
Figure 1D:
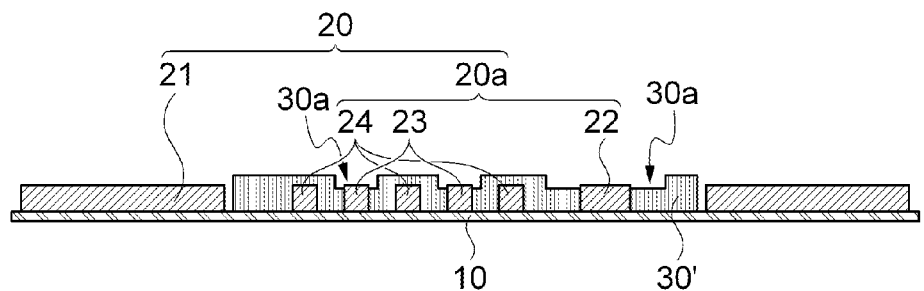
Figure 1E:
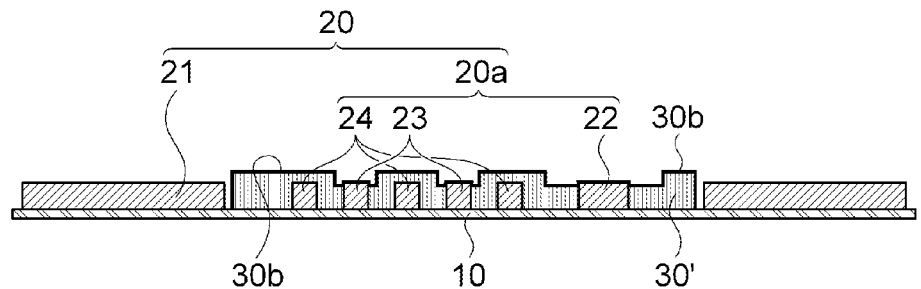
Figure 1F:
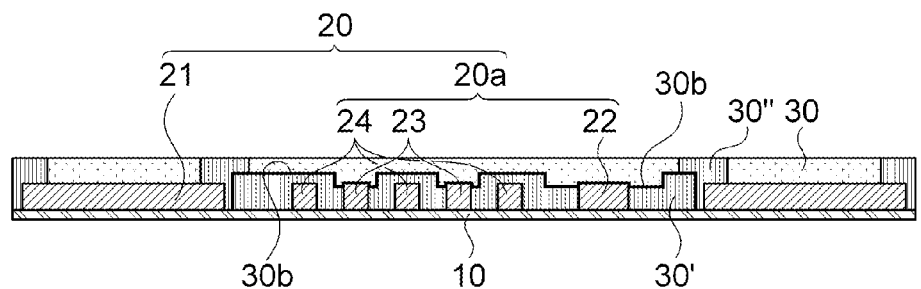
Figure 1G:
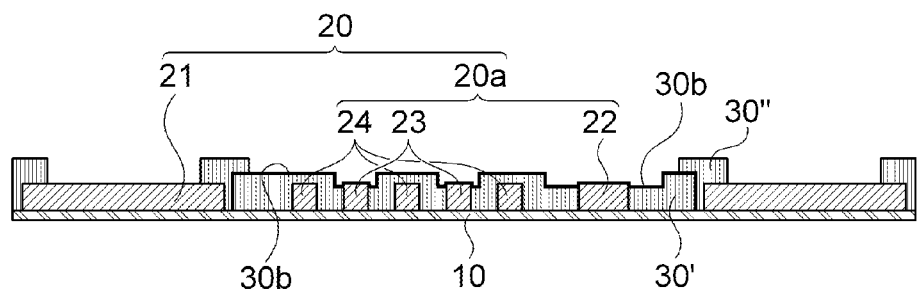
Figure 2A:
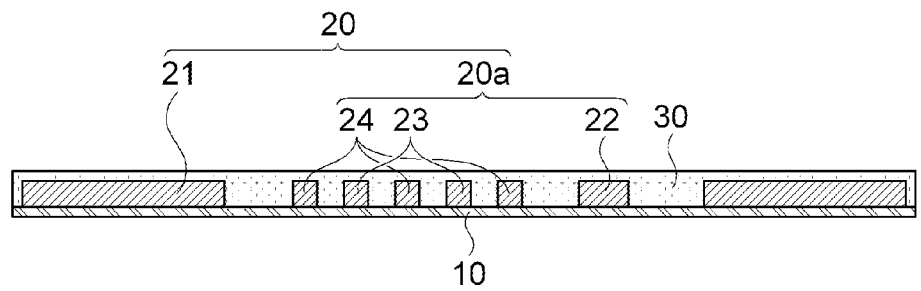
FIGS. 2a to 2f are views schematically showing a conventional method for forming solder resist.
Figure 2B:
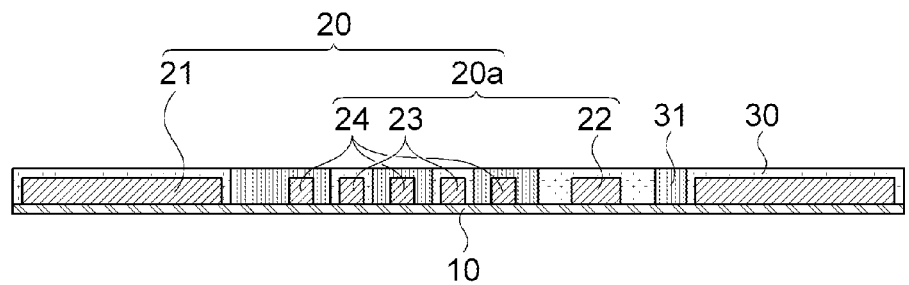
Figure 2C:
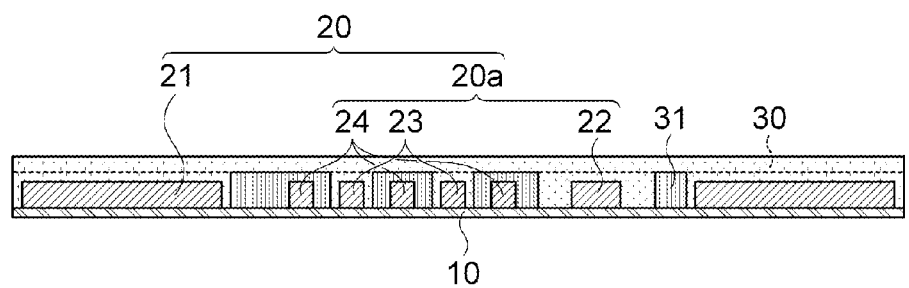
Figure 2D:
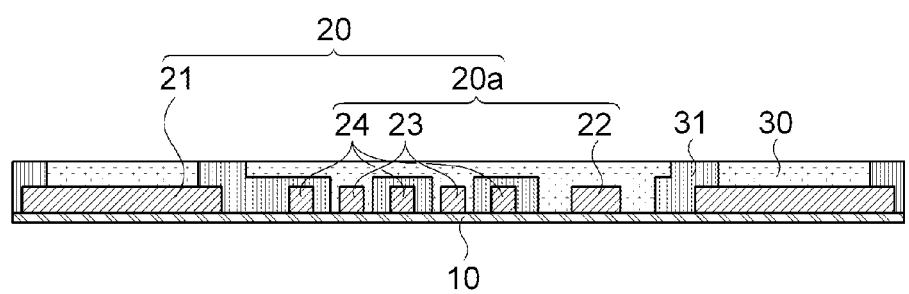
Figure 2E:
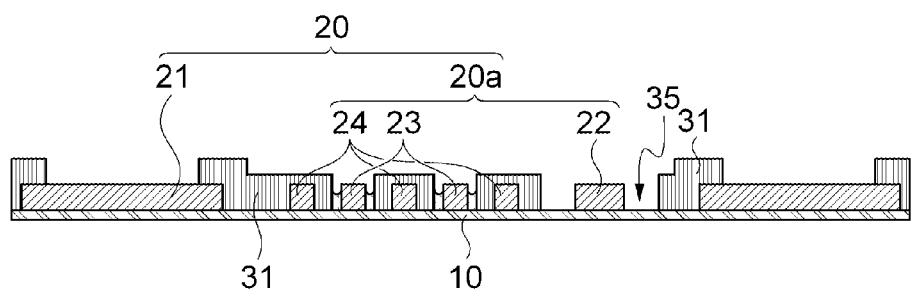
Figure 2F:
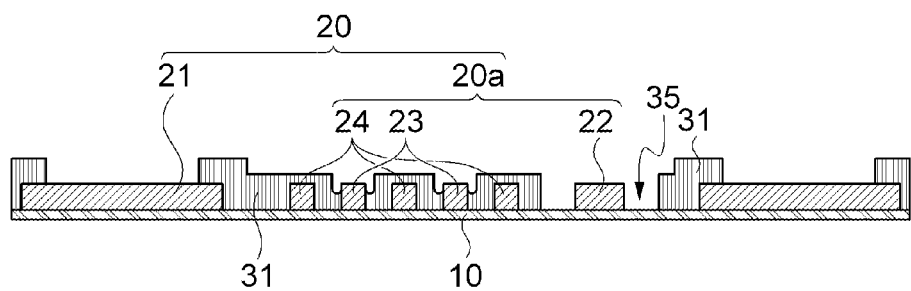

Referring to FIGS. 1a to 1g, a method for forming solder resist in accordance with an example may include the steps of forming a first solder resist inner region (refer to FIGS. 1a to 1c), forming a plugged SR region (refer to FIG. 1d), changing a surface roughness (refer to FIG. 1e), and forming a second solder resist SMD region (refer to FIGS. 1f and 1g).

First, the step of forming the first solder resist inner region will be described with reference to FIGS. 1a to 1c. In the step of forming the first solder resist inner region, solder resist 30 is primarily coated, exposed, and developed on a substrate 10 on which a circuit pattern 20 including an outer package-on-package (PoP) pad 21 for mounting an upper package (not shown) thereon and an inner chip pad 22 for mounting an inner chip (not shown) thereon is formed. For example, the circuit pattern 20 formed on the substrate 10 may further include a bump pad 23 as well as the PoP pad 21 and the chip pad 22. For example, a solder ball (not shown), which is to be bonded to the upper package (not shown), may be mounted on the outer PoP pad 21 to mount the upper package (not shown) thereon and an IC chip (not shown) may be mounted on the chip pad 22, for example, in a flip-chip manner but not limited thereto. That is, although not shown, the IC chip may be mounted on the chip pad 22 inside the substrate 10, for example, in a flip-chip manner and the solder ball may be mounted on the PoP pad 21 outside the substrate 10 to be connected to the upper package. The solder ball may be mounted on the PoP pad 21 to mount the upper package (not shown) thereon, thus forming a PoP substrate.

In an example, the primarily coated solder resist 30 may be made of one of a photocurable resin, a thermosetting resin, and photocurable and thermosetting resins.

In another example, the primarily coated solder resist 30 may be ink type or dry film type. For example, the primarily coated solder resist 30 may be ink type.

At this time, in the step of forming the first solder resist inner region, the first solder resist inner region 30' is formed by removing an outer portion of the solder resist 30 on the outer region of the substrate 10 on which the PoP pad 21 is formed and curing an inner portion of the solder resist 30 on the inner region of the substrate 10 on which the inner circuit pattern 20a including the chip pad 22 is formed.

Specifically describing with reference to FIGS. 1a to 1c, in an example, the step of forming the first solder resist inner region may include a solder resist primary coating step (refer to FIG. 1a), a primary exposure step (refer to 1b), and a primary developing and curing step (refer to FIG. 1c).

In the solder resist primary coating step of FIG. 1a, the solder resist 30 is primarily coated on the substrate 10 on which the circuit pattern 20 including the outer PoP pad 21 for mounting the upper package (not shown) thereon and the inner chip pad 22 for mounting the inner chip (not shown) thereon is formed. For example, the ink-type solder resist 30 may be primarily coated.

For example, a thickness of the primarily coated solder resist 30 may be less than 10 μm but not limited thereto. Accordingly, since a thickness of the first solder resist inner region 30' is too small, it is easy to apply laser ablation to form the plugged SR region 30a which will be described later.

In the primary exposure step of FIG. 1b, the primarily coated solder resist 30 is exposed to cure the first solder resist inner region 30' on the inner region of the substrate 10 on which the inner circuit pattern 20a including the chip pad 22 is formed. At this time, the desired region of the solder resist 30 may be cured using light of a specific wavelength, heat, or light and heat. For example, a photoresist pattern may be formed on the solder resist 30 to expose the solder resist 30 so that the first solder resist inner region 30' is cured.

In the primary developing and curing step of FIG. 1c, the primarily exposed solder resist 30 is developed and cured to remove the outer portion of the solder resist 30 on the outer region of the substrate 10 on which the PoP pad 21 is formed and leave the first solder resist inner region 30'. For example, the primarily exposed substrate 10 is dipped into a developing solution, developed to remove the outer portion of the solder resist 30 on the outer region of the substrate 10 on which the PoP pad 21 is formed, and dried to cure the remaining first solder resist inner region 30'.

Further, another example will be described with reference to FIGS. 1a to 1c. In an example, the inner circuit pattern 20a including the chip pad 22 may further include the bump pad 23 formed around the chip pad 22. Further, in an example, the inner circuit pattern 20a may further include other patterns 24 in addition to the chip pad 22 and the bump pad 23. For example, a wiring line etc. may be included in the other patterns 24. The other patterns 24 may be circuit patterns which are not exposed by the solder resist.

At this time, in the step of forming the first solder resist inner region, the first solder resist inner region 30' may be formed by curing the inner portion of the solder resist 30 on the inner region of the substrate 10 on which the inner circuit pattern 20a including the chip pad 22 and the bump pad 23 is formed.

Next, the step of forming the plugged SR region will be described with reference to FIG. 1d. In the step of forming the plugged SR region, the plugged SR region 30a, which does not expose the substrate 10 while exposing the entire upper surface of the chip pad 22, is formed by performing a laser ablation process, for example, a laser direct ablation (LDA) process on the first solder resist inner region 30' left after developing. That is, the plugged SR region 30a may be a non-solder mask defined (NSMD) region.

For example, since the thickness of the first solder resist inner region 30' is too small, it is possible to form a smaller opening, that is, the plugged SR region 30a compared to a typical exposure method by applying laser ablation, for example, LDA.

At this time, in accordance with an example, when the inner circuit pattern 20a further includes the bump pad 23 formed around the chip pad 22, in the step of forming the plugged SR region, the plugged SR region 30a, which does not expose the substrate 10 while exposing the entire upper surface of the chip pad 22 and the bump pad 23, may be formed by performing a laser ablation process.

Further, specifically describing with reference to FIG. 1d, in an example, in the step of forming the plugged SR region, the plugged SR region 30a may be formed so that a height of the plugged SR region 30a is lower than a height of the upper surface of the chip pad 22. That is, the height of the plugged SR region 30a formed around the inner circuit pattern 20a may be lower than a height of the corresponding inner circuit pattern 20a. For example, the height of the plugged SR region 30a formed around the bump pad 23 may be lower than a height of the bump pad 23.

Next, the step of changing the surface roughness will be described with reference to FIG. 1e. Referring to FIG. 1e, in this step, a desmear process is performed on a surface of the first solder resist inner region 30' in which the plugged SR region 30a is formed to change the surface roughness. It is possible to increase surface energy through the desmear treatment. Accordingly, a surface roughness of the first solder resist inner region 30', that is, the plugged SR region 30a is different from a surface roughness of the second solder resist SMD region 30" which will be described later. That is, the first solder resist inner region 30', that is, a surface 30b of the plugged SR region 30a and a surface of the second solder resist SMD region 30" may be different in characteristics such as surface energy, contact angle, hydrophilicity, or hydrophobicity.

Next, the step of forming the second solder resist SMD region will be described with reference to FIGS. 1f and 1g. In the step of forming the second solder resist SMD region, after performing the desmear process on the first solder resist inner region 30', the solder resist 30 is secondarily coated, exposed, and developed on the substrate 10. At this time, the solder resist 30 is exposed and developed after being secondarily coated on the first solder resist inner region 30' and the opened remaining substrate 10 region.

In an example, the secondarily coated solder resist 30 may be made of one of a photocurable resin, a thermosetting resin, and photocurable and thermosetting resins.

Further, in an example, the secondarily coated solder resist 30 may be ink type or dry film type. For example, the primarily coated solder resist 30 may be ink type, and the secondarily coated solder resist 30 may be dry film type.

At this time, in the step of forming the second solder resist SMD region, the second solder resist SMD region 30" may be formed by curing the secondarily coated solder resist 30 region which covers an edge of the PoP pad 21 and removing the remaining solder resist 30 region secondarily coated on the inner region of the PoP pad 21 and the first solder resist inner region 30'.

Further, specifically describing an example with reference to FIGS. 1f and 1g, the step of forming the second solder resist SMD region may include a solder resist secondary coating step, a secondary exposure step (refer to FIG. 1*f*), and a secondary developing and curing step (refer to FIG. 1*g*).

In the solder resist secondary coating step, after performing the desmear process on the first solder resist inner region 30', the solder resist 30 is secondarily coated on the substrate 10. For example, the dry film type solder resist 30 is secondarily coated on the first solder resist inner region 30' and the opened remaining substrate 10 region. A thickness of the secondarily coated solder resist 30 may be, for example, 20 to 25 µm but not limited thereto.

In the secondary exposure step of FIG. 1*f*, the solder resist 30 is secondarily exposed to cure the second solder resist SMD region 30" which covers an edge of the first solder resist inner region 30' and the edge of the PoP pad 21. At this time, the desired region of the solder resist 30 may be cured using light of a specific wavelength, heat, or light and heat. For example, a photoresist pattern may be formed on the secondarily coated solder resist 30 to expose the secondarily coated solder resist 30 so that the second solder resist SMD region 30" is cured.

Next, in the secondary developing and curing step of FIG. 1*g*, the secondarily exposed solder resist 30 is secondarily developed and cured to remove the remaining solder resist 30 region secondarily coated on the inner region of the PoP pad 21 and the first solder resist inner region 30' and leave the second solder resist SMD region 30". For example, the secondarily exposed substrate 10 is dipped into a developing solution, developed to remove the remaining solder resist 30 region secondarily coated on the inner region of the PoP pad 21 and the first solder resist inner region 30', and dried to cure the remaining second solder resist SMD region 30".

Further, although not shown, in an example, the step of forming the second solder resist SMD region may further include the step of improving the surface roughness of the second solder resist SMD region 30". In the step of improving the surface roughness of the second solder resist SMD region 30", a desmear process is performed on a surface of the secondarily developed and cured second solder resist SMD region 30" to improve the surface roughness of the second solder resist SMD region 30" differently from surface roughness of the first solder resist inner region 30'.

Next, a substrate for a package in accordance with a second embodiment of the present invention will be specifically described with reference to the drawing. At this time, the method for forming solder resist in accordance with the first embodiment described above will be referenced. Thus, repeated descriptions may be omitted.

FIG. 1*g* is a view schematically showing a substrate for a package in accordance with an embodiment of the present invention.

Referring to FIG. 1*g*, a substrate for a package in accordance with an example may be a substrate for a package-on-package on which an upper package (not shown) is mounted. The substrate for a package in accordance with an example may include a substrate 10, a circuit pattern 20, a first solder resist inner region 30', and a second solder resist SMD region 30".

The circuit pattern 20 is formed on the substrate 10. The circuit pattern 20 includes an outer PoP pad 21 for mounting the upper package (not shown) thereon and an inner chip pad 22 for mounting an inner chip (not shown). A solder ball, which is to be connected to the upper package, may be mounted on the outer PoP pad 21 to mount the upper package (not shown) thereon and an IC chip (not shown) may be mounted on the chip pad 22, for example, in a flip-chip manner but not limited thereto. The upper package (not shown) may be mounted on the PoP pad 21 to form a package-on-package substrate.

Further, in accordance with an example, as shown in FIG. 1*g*, an inner circuit pattern 20*a* including the chip pad 22 may further include a bump pad 23 formed around the chip pad 22. For example, referring to FIG. 1*g*, in an example, the inner circuit pattern 20*a* may further include other patterns such as wiring lines in addition to the chip pad 22 and the bump pad 23.

Next, the first solder resist inner region 30' will be described. The first solder resist inner region 30' is formed by being coated on an inner region of the substrate 10 on which the inner circuit pattern 20*a* including the chip pad 22 is formed. For example, the cured first solder resist inner region 30' may be formed on the inner region of the substrate 10, on which the inner circuit pattern 20*a* is formed, through exposure and development after applying or coating solder resist 30 on the substrate 10.

For example, in an example, when the inner circuit pattern 20*a* includes the bump pad 23 in addition to the chip pad 22, the first solder resist inner region 30' may be formed on the inner region of the substrate 10 on which the inner circuit pattern 20*a* including the chip pad 22 and the bump pad 23 is formed.

In an example, the cured first solder resist inner region 30' may be formed by performing exposure and development after applying or coating the solder resist 30 made of one of a photocurable resin, a thermosetting resin, and photocurable and thermosetting resins.

Continuously, referring to FIG. 1*g*, the first solder resist inner region 30' includes a plugged SR region 30*a* which does not expose the substrate 10 while exposing the entire upper surface of the chip pad 22 by laser ablation. That is, the plugged SR region 30*a* may be a non-solder mask defined (NSMD) region. For example, an IC chip (not shown) may be mounted on the plugged SR region 30*a*, which exposes the chip pad 22, to be mounted on the chip pad 22, for example, in a flip-chip manner, but the mounting method is not limited to the flip-chip manner.

For example, in an example, when the first solder resist inner region 30' is formed on the inner region of the substrate 10 on which the inner circuit pattern 20*a* including the chip pad 22 and the bump pad 23 is formed, the plugged SR region 30*a* may be formed by laser ablation not to expose the substrate 10 while exposing the entire upper surface of the chip pad 22 and the bump pad 23.

Although not limited to the following size, for example, the plugged SR region 30*a* formed around the chip pad 22 may have a size or diameter of about 100 to 200 µm, the plugged SR region 30*a* formed around the bump pad 23 may have a size or diameter of about of 40 µm, and an exposed region of the PoP pad 21 exposed between second solder resist SMD regions 30" described later may have a size or diameter of 200 to 300 µm.

In an example, a height of the plugged SR region 30*a* is lower than a height of the upper surface of the chip pad 22. That is, the height of the plugged SR region 30*a* formed around the inner circuit pattern 20*a* may be lower than a height of the corresponding inner circuit pattern 20*a*. For example, in an example, the height of the plugged SR region 30*a* formed around the bump pad 23 may be lower than a height of the bump pad 23.

Further, the first solder resist inner region 30' including the plugged SR region 30*a* is desmeared to have a changed surface roughness. Accordingly, the first solder resist inner region 30' including the plugged SR region 30a has a different surface roughness from the following second solder resist SMD region 30".

For example, in an example, the surface roughness of the plugged SR region 30a on the first solder resist inner region 30' may be higher than the surface roughness of the second solder resist SMD region 30".

Next, the second solder resist SMD region 30" will be described. The second solder resist SMD region 30" is formed to cover an edge of the first solder resist inner region 30' and an edge of the PoP pad 21. For example, the cured second solder resist SMD region 30", which covers the edge of the first solder resist inner region 30' and the edge of the PoP pad 21, may be formed through exposure and development after secondarily applying or coating the solder resist 30 on the first solder resist inner region 30' and the opened substrate 10. For example, a solder ball, which is to be connected to an upper package, may be mounted on the PoP pad 21 exposed by the second solder resist SMD region 30" to mount the upper package (not shown) thereon.

In an example, the second solder resist SMD region 30" may be formed through exposure and development after secondarily applying or coating the solder resist 30 made of one of a photocurable resin, a thermosetting resin, and photocurable and thermosetting resins.

The second solder resist SMD region 30" has a surface roughness different from the surface roughness of the plugged SR region 30a on the first solder resist inner region 30'.

At this time, in an example, a height of the second solder resist SMD region 30" is higher than a height of the first solder resist inner region 30'.

According to the embodiments of the present invention, it is possible to differentiate a surface roughness of an inner chip mounting region from a surface roughness of an outer upper package mounting region.

Further, it is possible to properly fill solder resist between circuit patterns of the inner chip mounting region while differentiating SR surface energy of the inner chip mounting region from SR surface energy of a PoP region.

It is apparent that various effects which have not been directly mentioned according to the various embodiments of the present invention can be derived by those skilled in the art from various constructions according to the embodiments of the present invention.

The above-described embodiments and the accompanying drawings are provided as examples to help understanding of those skilled in the art, not limiting the scope of the present invention. Further, embodiments according to various combinations of the above-described components will be apparently implemented from the foregoing specific descriptions by those skilled in the art. Therefore, the various embodiments of the present invention may be embodied in different forms in a range without departing from the essential concept of the present invention, and the scope of the present invention should be interpreted from the invention defined in the claims. It is to be understood that the present invention includes various modifications, substitutions, and equivalents by those skilled in the art.

What is claimed is:

1. A substrate for a package comprising:
    a substrate;
    a circuit pattern formed on the substrate and comprising an outer package-on-package (PoP) pad for mounting an upper package thereon and a chip pad for mounting an inner chip thereon;
    a first solder resist (SR) inner region formed by being coated on an inner region of the substrate on which the inner circuit pattern comprising the chip pad is formed, comprising a plugged SR region which does not expose the substrate while exposing the entire upper surface of the chip pad by laser ablation, and desmeared to have a changed surface roughness; and
    a second solder resist SMD region formed to cover an edge of the first solder resist inner region and an edge of the POP pad and having a surface roughness different from a surface roughness of the plugged SR region on the first solder resist inner region.

2. The substrate for a package according to claim 1, wherein the surface roughness of the plugged SR region on the first solder resist inner region is higher than the surface roughness of the second solder resist SMD region.

3. The substrate for a package according to claim 1, wherein the inner circuit pattern comprising the chip pad further comprises a bump pad formed around the chip pad,
    the first solder resist inner region is formed on the inner region of the substrate on which the inner circuit pattern comprising the chip pad and the bump pad is formed, and
    the plugged SR region is formed by laser ablation not to expose the substrate while exposing the entire upper surface of the chip pad and the bump pad.

4. The substrate for a package according to claim 1, wherein a height of the plugged SR region is lower than a height of the upper surface of the chip pad.

5. The substrate for a package according to claim 1, wherein a height of the second solder resist SMD region is higher than a height of the first solder resist inner region.

6. The substrate for a package according to claim 1, wherein the first solder resist inner region and the second solder resist SMD region are made of one of a photocurable resin, a thermosetting resin, and photocurable and thermosetting resins.

* * * * *

UNITED STATES PATENT AND TRADEMARK OFFICE
CERTIFICATE OF CORRECTION

Page 1 of 1

PATENT NO. : 9,040,838 B2
APPLICATION NO. : 14/011159
DATED : May 26, 2015
INVENTOR(S) : Chang Bo Lee et al.

It is certified that error appears in the above-identified patent and that said Letters Patent is hereby corrected as shown below:

Specification,

Column 1 lines 10-17, above "BACKGROUND OF INVENTION" delete "CROSS REFERENCE TO RELATED APPLICATION This application claims the benefit under 35 U.S.C. Section 119 of Korean Patent Application Serial No. 10-2012-0093680, entitled filed Aug. 27, 2012, which is hereby incorporated by reference in its entirety into this application."

Signed and Sealed this
Twentieth Day of October, 2015

Michelle K. Lee
*Director of the United States Patent and Trademark Office*